(12) United States Patent
Udrea et al.

(10) Patent No.: US 7,994,569 B2
(45) Date of Patent: Aug. 9, 2011

(54) SEMICONDUCTOR DEVICE AND METHOD FOR FORMING THE SAME

(75) Inventors: Florin Udrea, Cambridge (GB); Chih-Wei Hsu, Taipei (TW)

(73) Assignee: Anpec Electronics Corporation, Hsinchu (TW)

( * ) Notice: Subject to any disclaimer, the term of this patent is extended or adjusted under 35 U.S.C. 154(b) by 549 days.

(21) Appl. No.: 12/186,966

(22) Filed: Aug. 6, 2008

(65) Prior Publication Data

US 2009/0283796 A1 Nov. 19, 2009

Related U.S. Application Data

(63) Continuation of application No. 61/053,475, filed on May 15, 2008.

(51) Int. Cl.
*H01L 29/76* (2006.01)
(52) U.S. Cl. .................................. 257/329; 438/270
(58) Field of Classification Search .................. 257/329, 257/330, 341, E29.257, E21.418; 438/212, 438/259, 268, 270, 271, 272
See application file for complete search history.

(56) References Cited

U.S. PATENT DOCUMENTS

| | | | | |
|---|---|---|---|---|
| 5,319,222 A | * | 6/1994 | Shekar et al. | 257/138 |
| 6,137,122 A | * | 10/2000 | Liaw et al. | 257/132 |
| 7,301,220 B2 | | 11/2007 | Udrea | |

* cited by examiner

*Primary Examiner* — David Vu
(74) *Attorney, Agent, or Firm* — WPAT, P.C.; Anthony King

(57) ABSTRACT

A bipolar high voltage/power semiconductor device having a low voltage terminal and a high voltage terminal is disclosed. The bipolar high voltage/power semiconductor is a vertical insulated gate bipolar transistor with injection efficiency adjustment formed by highly doped n+ islands in a p+ anode layer. The device has a vertical drift region of a first conductivity type and having vertical first and second ends. In one example, a region of the second conductivity type is provided at the second end of the vertical drift region connected directly to the vertical high voltage terminal. In another example, a vertical buffer region of the first conductivity type is provided at the vertical second end of the vertical drift region and a vertical region of a second conductivity type is provided on the other side of the vertical buffer region and connected to the vertical high voltage terminal. A plurality of electrically floating lateral island regions are provided within the vertical drift region at or towards the vertical second end of the vertical drift region, the plurality of electrically floating lateral island regions being of the first conductivity type and being more highly doped than the drift region.

13 Claims, 18 Drawing Sheets

Proir Art

Proir Art**

Proir Art**

Proir Art**

Proir Art**

Proir Art**

Proir Art
(U.S. Pat. No. 7,301,220)**

SEMICONDUCTOR DEVICE AND METHOD FOR FORMING THE SAME

BACKGROUND OF THE INVENTION

1. Field of the Invention

The present invention generally relates to an insulated gate bipolar transistor, and in particular, relates to a vertical insulated gate bipolar transistor and a method of manufacturing the same.

2. The Prior Arts

An IGBT (Insulated Gate Bipolar Transistor) features a MOS gate for high impedance voltage-control and bipolar conduction for reducing the drift on-state resistance (through 'conductivity modulation'). It can be seen as a successful combination between a Power MOSFET and a bipolar transistor. The IGBT operates commonly in the range of 500 V to 8 kV with current capability ranging from a few hundred mA for Power ICs to 5000 A for applications in HVDC or traction. Their strongest market is in motor control with voltage ratings from 500 V to 1.2 kV and current capability from 5 A to 500 A.

Function of the structure of the drift region and the anode structure and in particular the extension of the depletion region into the drift region at breakdown, the IGBTs can be split into three categories (a) Punch Trough (PT); (b) NON Punch-Through (NPT); and (c) Soft Punch Through (SPT), also known as Field Stop IGBT (FS IGBT) or Light Punch Through IGBT (LPT IGBT).

(a) PT IGBT

The main characteristics of the PT IGBT are that the depletion region fills the whole of the drift region in the blocking mode at or before avalanche breakdown occurs. To stop the depletion region reaching the p+ anode region, a buffer layer of the same conductivity type as that of the drift region but more highly doped is inserted between the drift region and the p+ anode layer. For devices rated at 600V, 1.2 kV and 1.7 kV the punch-through (PT) device is based on an epitaxial drift region/buffer grown on a highly doped p+ substrate. While the drift layer is very thin and can potentially give benefits in the on-state and cutting the turn-off tail, the device requires electron irradiation or well controlled local ion irradiation with high energy implants to increase its switching speed and hence reduce its transient losses.

(b) NPT IGBT

The "Non Punch Through" NPT-IGBT has a homogeneous substrate material (float zone) as the drift region. For an n-channel device (virtually all the IGBTs today are n-channel devices), the drift region is of n-type. Its doping is the lowest of all regions. The exact level and the length are determined to withstand the rated breakdown voltage. The p+ anode is usually built as a thin and relatively lowly doped layer (still considerably more highly doped than the drift region) after most of the fabrication steps to build the top of the device (e.g. diffusions, implantations, gate oxidation, etc) are carried out. The depletion region at breakdown does not fill the entire drift region. A protective margin of a drift region, typically 20-40 microns is left between the end of the depletion region at breakdown and the edge of the p+ anode layer. The NPT IGBT has shown increased robustness during short-circuit conditions and a more desirable plasma distribution in the on-state which overall cuts the switching losses in spite of its increased drift length. This is because in NPT-IGBTs the bipolar gain is adjusted via the injection efficiency of the anode layer (the emitter of the pnp transistor) rather than the base transport factor (which is dependent on the lifetime of the carriers) as it is the case in PT IGBTs. As a result the charge distribution in NPT-IGBTs is more uniform with a lower peak value at the anode side, which in turn results in a less lossy turn-off. However, as already mentioned, the PT structure has the potential to lower the on-state losses on account of its reduced drift length.

(c) SPT IGBT

The SPT IGBT combines the advantages of the two structures, PT and NPT IGBTs. It has been proposed a few years ago and is called Soft Punch-Through (SPT), Field Stop (FS), or Light Punch-Through (LPT).

The SPT IGBT is based on having a punch-through type drift region (similarly to that of the PT IGBT) but unlike in the PT IGBT, it features a lightly doped buffer and a lightly doped and transparent anode. The idea is to adjust the plasma (i.e. excess charge) in the drift region by controlling the injection efficiency of the anode junction rather than the base transport factor of the bipolar transistor. The buffer layer no longer suppresses the hole injection as it is relatively lowly doped, but its role is only to stop the parasitic punch-through breakdown by preventing the depletion region (the high electric field) to reach the anode junction. Its doping should be low enough not to influence the hole injection but high enough to stop the electric field. Thus its role is to make sure that the punch-through breakdown does not take place before avalanche in the drift region. The buffer can also be designed that the two effects (i.e. punch-through and avalanche) take place almost concomitantly. The name of soft punch through comes from the softer characteristics obtained during the switching (when compared to a PT structure). The use of the lightly doped buffer offers a 'soft' extension of the depletion region inside this layer as opposed to an abrupt stop which can generate noise, overshoots and/or EMI issues.

FIG. 1a shows a schematic view of a PT IGBT according to the prior art. FIG. 1b shows a schematic view of a NPT IGBT according to the prior art. And FIG. 1c shows a schematic view of a SPT IGBT according to the prior art. As shown in FIG. 1a to FIG. 1c, the three structures, PT IGBT, NPT IGBT and SPT IGBTs are shown. The dimensions are example for a 1.2 kV rating. It can be seen that PT substrate (wafer) is of p+ doping while the n buffer and the n− drift region are grown epitaxially. The trade-off between on-state and turn-off losses is adjusted most commonly by electron irradiation of the entire n-drift region. In NPT structure the substrate (wafer) is of n− drift region and the trade-off between on-state and turn-off losses is adjusted via the injection efficiency of the p+ anode/n− drift p-n junction. For this the p+ anode is relatively lowly doped (e.g. $1 \times 10^{17}$ cm$^{-3}$) and is relatively thin (e.g. 1 micron). The NPT drift region is however thicker than that of the PT device. In SPT device, the n− drift region is the substrate (wafer), but is as thin as that of a PT device. The on-state and turn-off losses are adjusted via the injection efficiency of the p+ anode/n− buffer p-n junction.

TABLE 1 shows the relative qualitative performance of the three devices. In most categories SPT is a winning solution.

TABLE 1

| | Structure | | |
| --- | --- | --- | --- |
| | PT - IGBT | NPT - IGBT | SPI - IGBT |
| Drift layer thickness | thin | thick | Thin |
| Wafer type (for 600 V and 1.2 kV) | Epitaxial | Float zone (FZ) | Float Zone (FZ) |
| Buffer Layer | Thick and highly doped | N/A | Thin and lowly doped |
| P+ anode injector | Thick and highly | Thin and relatively | Thin and relatively |

TABLE 1-continued

| | Structure | | |
|---|---|---|---|
| | PT - IGBT | NPT - IGBT | SPI - IGBT |
| | doped (whole substrate) | lowly doped | lowly doped |
| Bipolar gain control | Lifetime killing | Injection efficiency | Injection efficiency |
| On-state losses | low | medium | low |
| Switching losses | high | medium | low |
| Turn-off tail | short | long | short |
| Voltage overshoot (in some applications) | high | low | Low |
| Temperature coefficient | negative (mostly) | positive | positive |
| SCSOA (short circuit conditions) | medium | large | large |
| RBSOA (reverse bias conditions) | narrow | large | Large |

The adjustment of injection efficiency by using a lowly doped transparent anode in SPT device is very similar to the concept employed in the NPT IGBT. However unlike in NPT IGBT, the drift region is significantly thinner. As a result, the charge distribution in the SPT IGBT is more favourable, allowing for a 'closer to optimal' loss profile. It is already known that a significant advantage can be obtained by lowering the charge at the anode side (which is responsible for the long turn-off tail of the IGBT) and maintaining un-affected or even increasing the excess charge at the other side of the drift region, in order to minimize the on-state losses. The control of the anode injection efficiency while maintaining a high carrier lifetime in the drift region achieves exactly this. The charge no longer deeps in the middle as it is the case with uniform lifetime killing, which leads to poor trade-off between on-state performance and switching losses, but the charge is only lowered at the anode side which leads to an almost flat profile along the drift region (see FIG. 3). As a result, in the SPT IGBT both the on-state losses and switching losses can be minimized. The SPT IGBT turn-off is significantly faster than both the PT and NPT IGBT reducing the switching losses by 10-30%. Given its short drift length, the SPT-IGBT can also additionally reduce the on-state losses by 10-20% compared to state-of-the-art NPT IGBTs.

Function of the geometrical arrangement of the MOS channel, the IGBTs can be split into two categories. In DMOS IGBTs, the channel is horizontal while in the Trench IGBT the channel is vertical. The trench technology has considerable advantages over the DMOS technology, such as higher electron injection at the top of the n– drift region, more natural, one-dimensional current flow, no parasitic JFET effect, higher channel density etc. FIG. 1 shows the three structures NPT IGBT, PT IGBT and SPT IGBT in DMOS technology. All these structures can also employ trench gate structures. For example an SPT IGBT in trench technology is shown in FIG. 2. Not only that the trench improves the channel density (thus minimizing the on-state voltage drop on the channel) but its strong PIN diode effect (injection enhanced effect) increases the charge at the cathode side of the drift region, thus leading to an even lower on-state without compromising the turn-off speed. FIG. 3 shows the carrier distribution in a NPT IGBT (based on transparent anode), a PT IGBT (based on uniform lifetime killing), a DMOS SPT IGBT and a Trench SPT IGBT. The use of trench coupled with the SPT structure allows an almost ideal plasma distribution with a relatively low peak at the anode side and slightly increased peak at the cathode side. In addition the trench also helps to reduce the latch-up susceptibility and suppress the parasitic JFET effect. Given its advantageous carrier profile, the SPT structure offers a clearly superior trade-off between on-state and turn-off energy losses. The graph in FIG. 4 shows schematically the trade-off between PT, NPT & SPT DMOS and Trench IGBTs for 1.2 kV. Similar graphs can be shown for other rated voltages such as 600 V, 1.7 kV, 3.3 kV, 4.5 kV or 6.5 kV.

From the description of state-of-the-art in IGBTs given above, it is clear that the SPT IGBT offers significantly better performance than both NPT and PT IGBT. However the SPT IGBT employs very thin wafers (e.g. 100 microns) which are very difficult to handle during fabrication. Also, the use of special handle wafers and updating of equipment to allow processing of such wafers lead to a considerable cost increase. At the same time the formation of the lightly doped n– buffer layer and the p+ anode are very difficult steps to control, as these need to be done after the formation of virtually all the layers at the top of the device. As a result, the n– buffer layer and the p– anode are done using 'cold' processes with temperatures below 500° C.

On the other hand, the PT structure is convenient and relatively cheap to make and does not require handling of thin wafers. However the use of electron irradiation leads to poorer overall electrical performance. In addition, the electron irradiation affects the threshold voltage of the device. An extra annealing step to recover the threshold voltage is necessary. Nevertheless the variation in the threshold voltage from wafer to wafer and batch to batch remains relatively high and the overall yield in general is affected.

In U.S. Pat. No. 7,301,220, a technique is proposed to adjust the injection efficiency by introducing highly doped n+ islands in the n buffer layer of a lateral IGBT (FIG. 5). This technique is conceived for lateral structures to be used in integrated circuits. The n+ islands are formed during the fabrication of the cathode n+ and CMOS n+ source and drain layers.

SUMMARY OF THE INVENTION

The present invention provides an vertical insulated gate bipolar transistor with injection efficiency adjustment formed by highly doped n+ islands in a p+ anode layer and a method of manufacturing thereof.

Unlike U.S. Pat. No. 7,301,220, this invention deals with vertical IGBT devices and the n+ islands are formed at the beginning of the process before the drift region is formed and before the top layers (e.g. n+ cathode) are formed. At the same time, in the preferred embodiment of this invention, the n+ discretised layer is formed directly into the p+ substrate.

It is the objective of this invention to propose an alternative way to adjust the trade-off performance between on-state and turn-off losses, without the use of electron irradiation and without the use of expansive thin wafer technology.

DETAILED DESCRIPTION OF THE PREFERRED EMBODIMENT

Figure 1A:
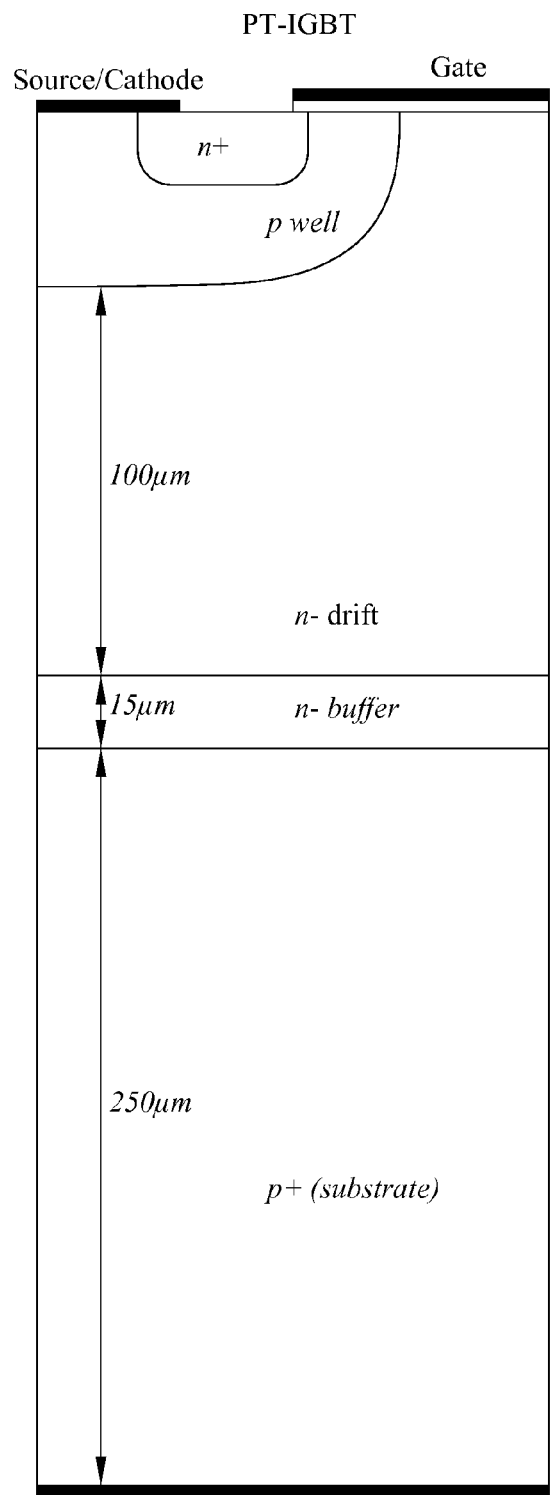
FIG. 1a shows a schematic view of a PT IGBT according to the prior art.
Figure 1B:
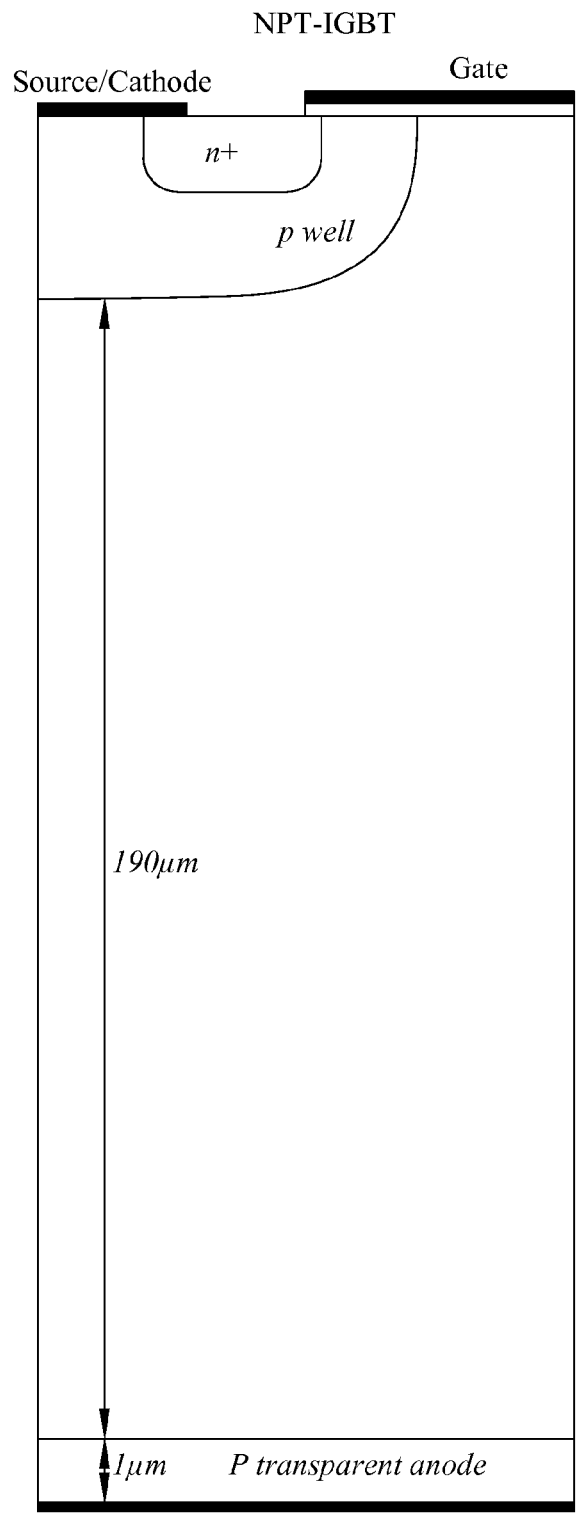
FIG. 1b shows a schematic view of a NPT IGBT according to the prior art.
Figure 1C:
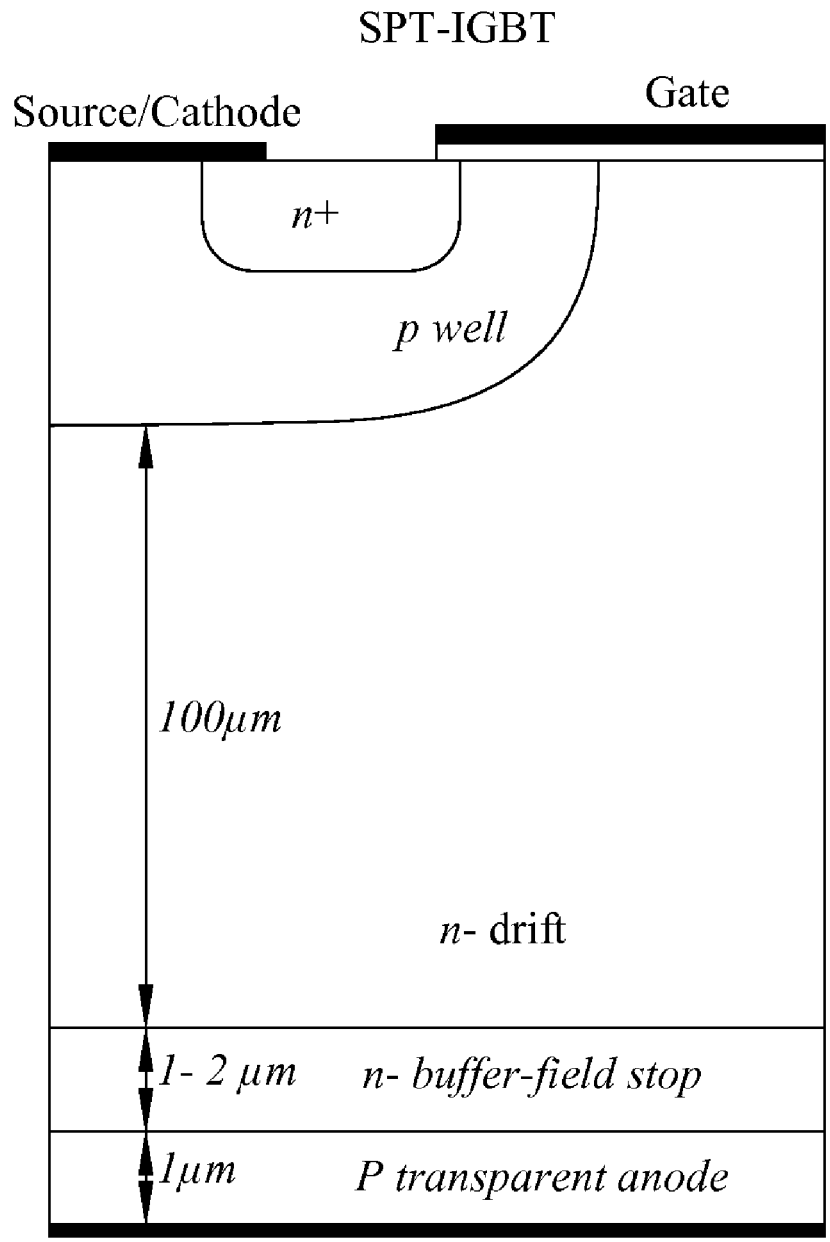
FIG. 1c shows a schematic view of a SPT IGBT according to the prior art.
Figure 2:
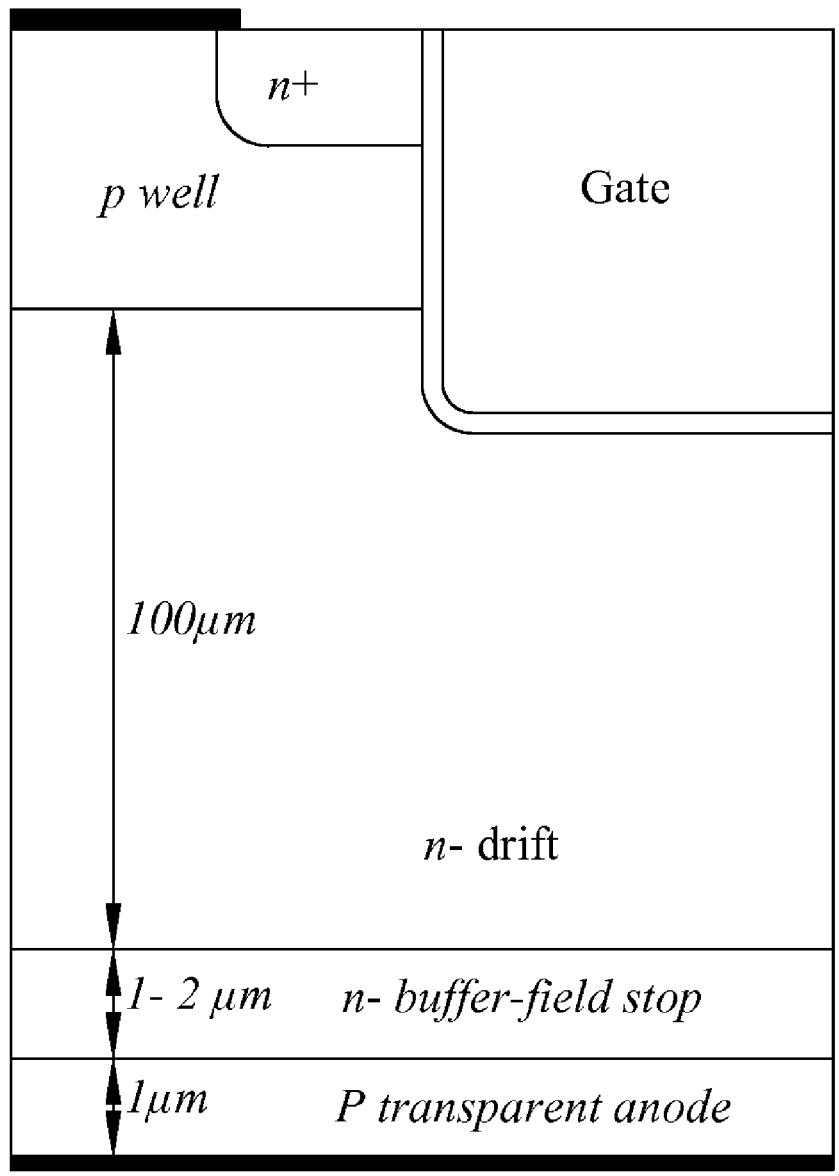
FIG. 2 shows a schematic view of a SPT IGBT according to trench technology.
Figure 3:
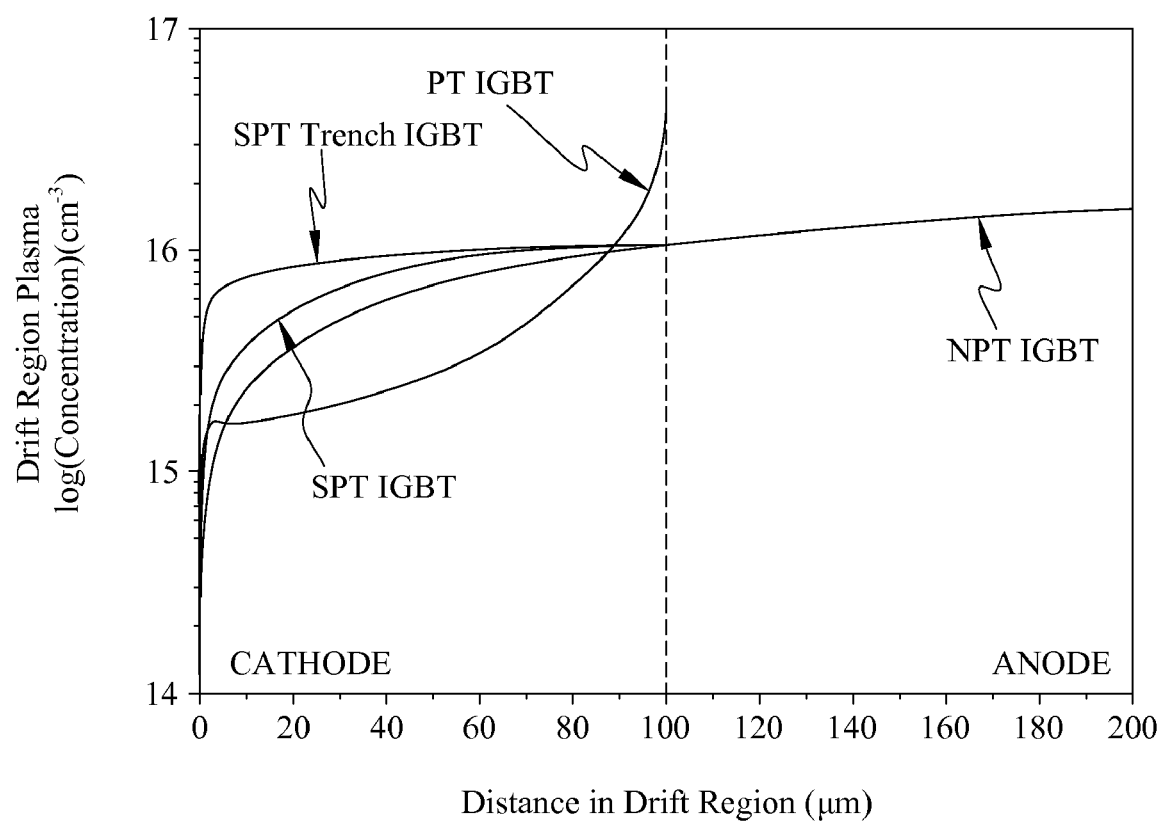
FIG. 3 shows schematically the carrier distribution in a NPT IGBT based on transparent anode, a PT IGBT based on uniform lifetime killing, a DMOS SPT IGBT, and a Trench SPT IGBT.
Figure 4:
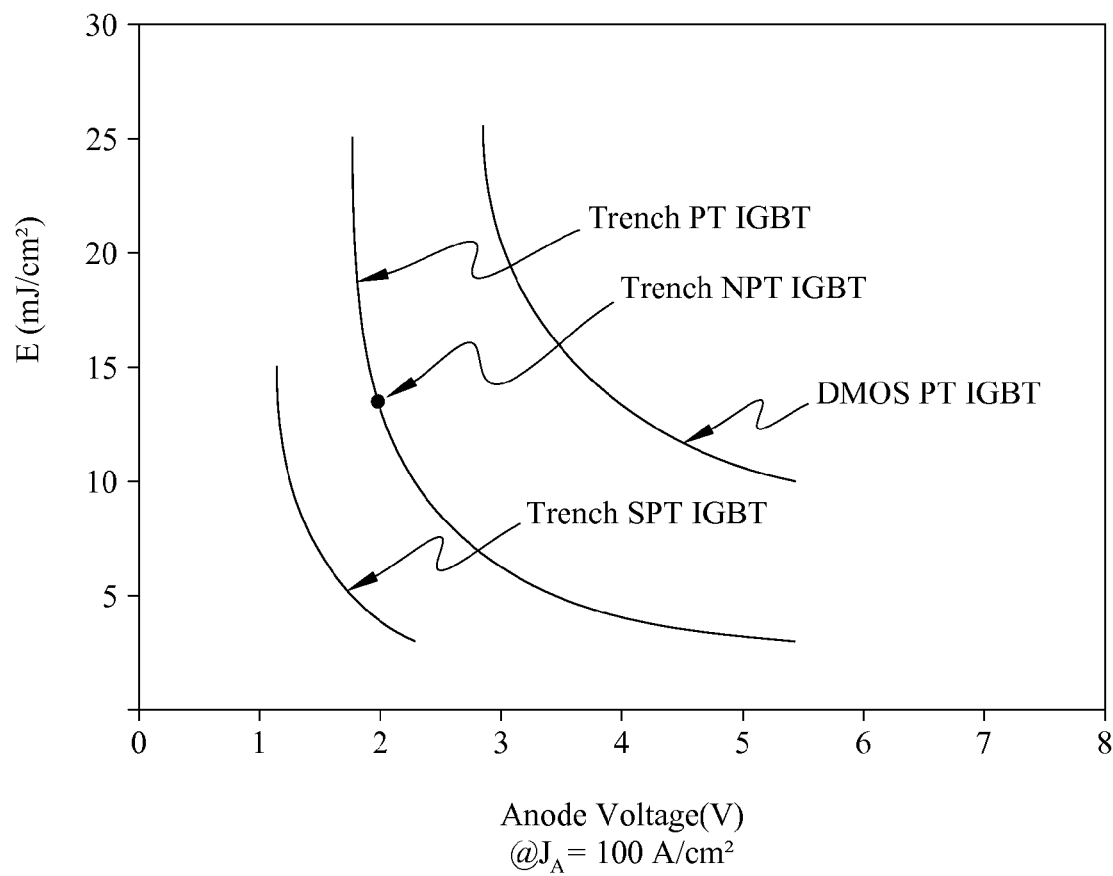
FIG. 4 shows schematically the trade-off between PT, NPT and SPT DMOS and Trench IGBTs for 1.2 kV.
Figure 5:
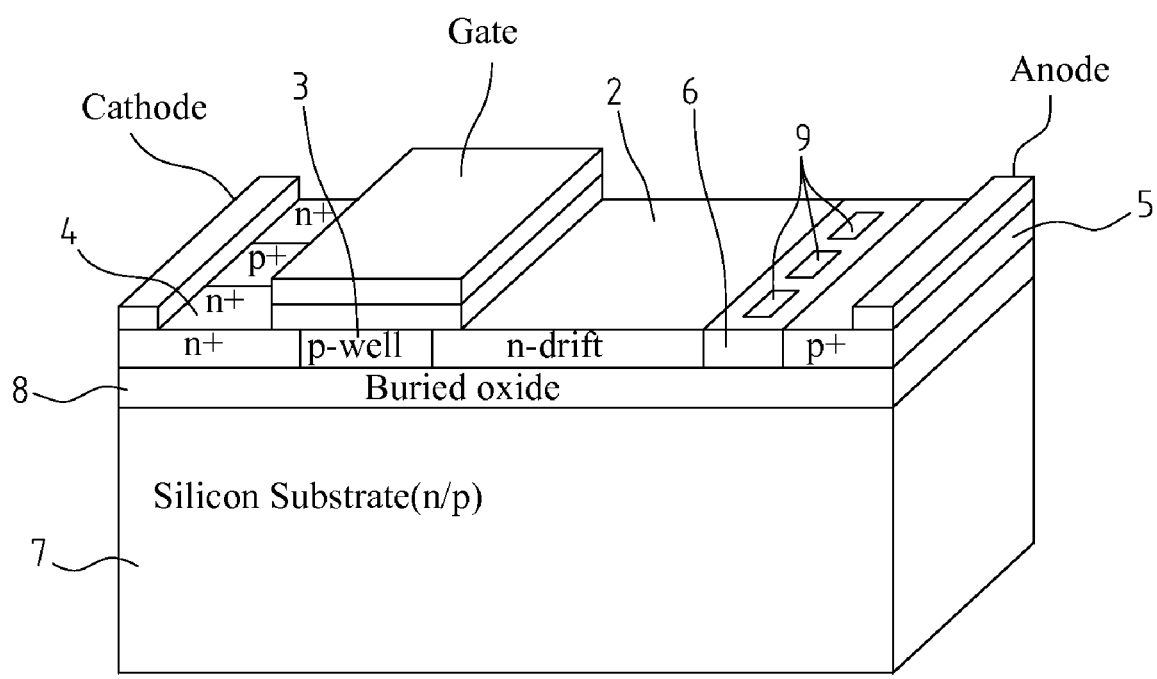
FIG. 5 shows a schematic view of a lateral insulated gate bipolar transistor (LIGBT) according to an embodiment of U.S. Pat. No. 7,301,220.
Figure 6:
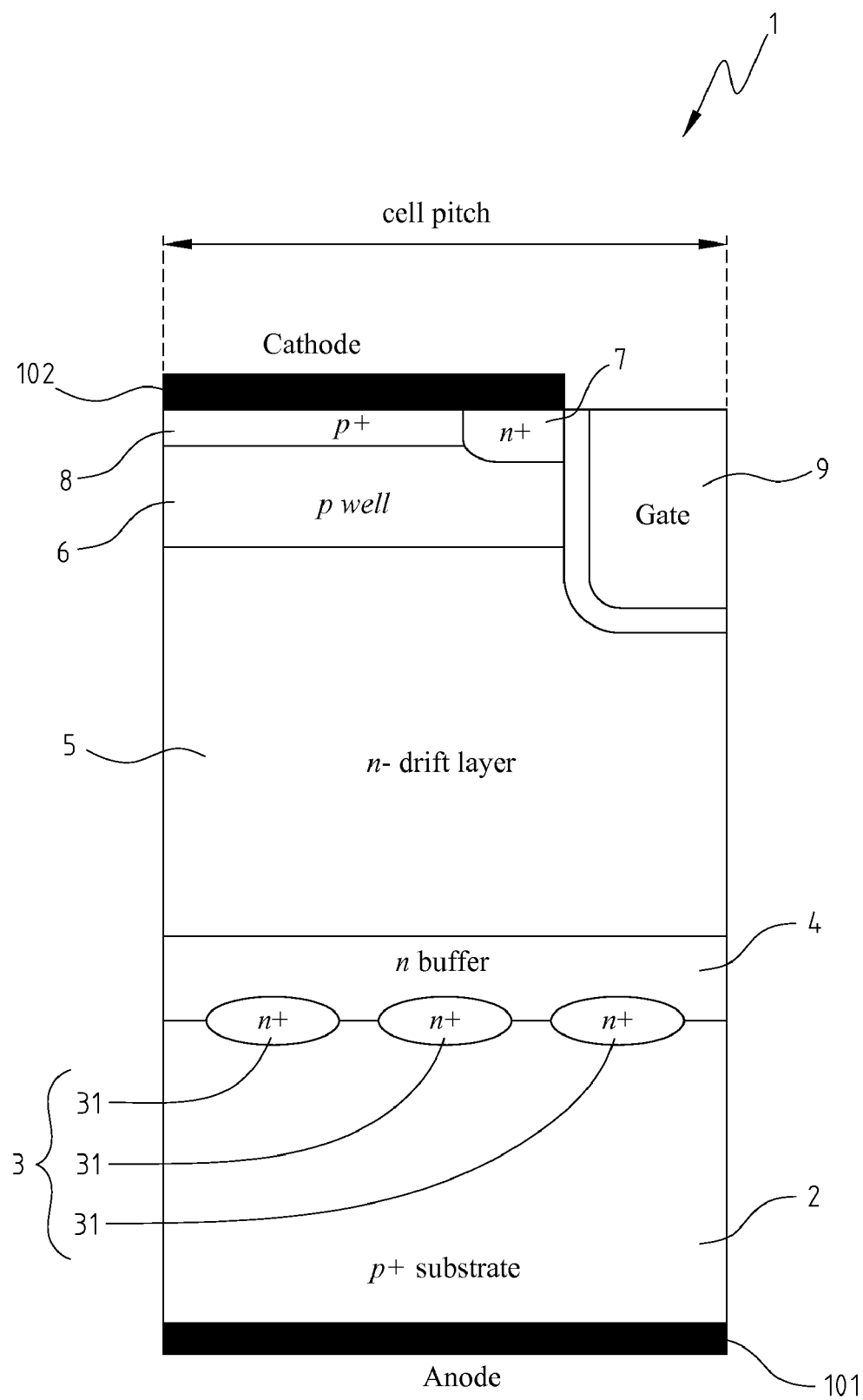
FIG. 6 shows a schematic view of a vertical insulated gate bipolar transistor according to an embodiment of the present invention.

FIG. 6 shows schematically a perspective view of a vertical insulated gate bipolar transistor according to an embodiment of the present invention. According to a first aspect of this invention and referring to FIG. 6, there is provided a vertical device in the form of an insulated gate bipolar transistor (IGBT), 1, that includes a p+ substrate 2, a n buffer 4, a discretised n+ layer 3 that is arranged in multiple regions overlapping the p+ substrate 2 and the n-buffer 4, a n− drift layer 5, a p well 6, an n+ cathode/source region 7, a cathode short region 8, an insulated gate 9 formed of a gate oxide and a polysilicon layer and metallisation layers for the anode 101 and cathode 102; where the geometry/layout dimensions of the discretised n+ layer 3 adjust the level of excess charge (plasma) in the on-state and thus adjust the level of conductivity modulation of the n− drift layer 5, and as a result, the on-state versus switching performance of the device 1.

Preferably the doping level of the discretised n+ layer 3 is higher than that of the p+ substrate 2.

According to this invention, the discretised n+ layer 3 adjusts the effective injection efficiency of the pnp bipolar structure, and the discretised n+ layer 3 comprises a plurality of n+ islands 31. The width and spacing of the n+ islands 31 dictate the amount of holes that are injected from the p+ substrate 2 and thus adjust the amount of excess charge that is built in the n− drift layer 5 during on-state operation for a given current density. The presence of higher excess charge leads to better on-state performance at the expense of poorer switching performance. Different system applications of the device require different trade-offs between the on-state and switching performance. In general higher operating frequency applications require faster switching and thus less excess charge in the drift region.

Figure 7:
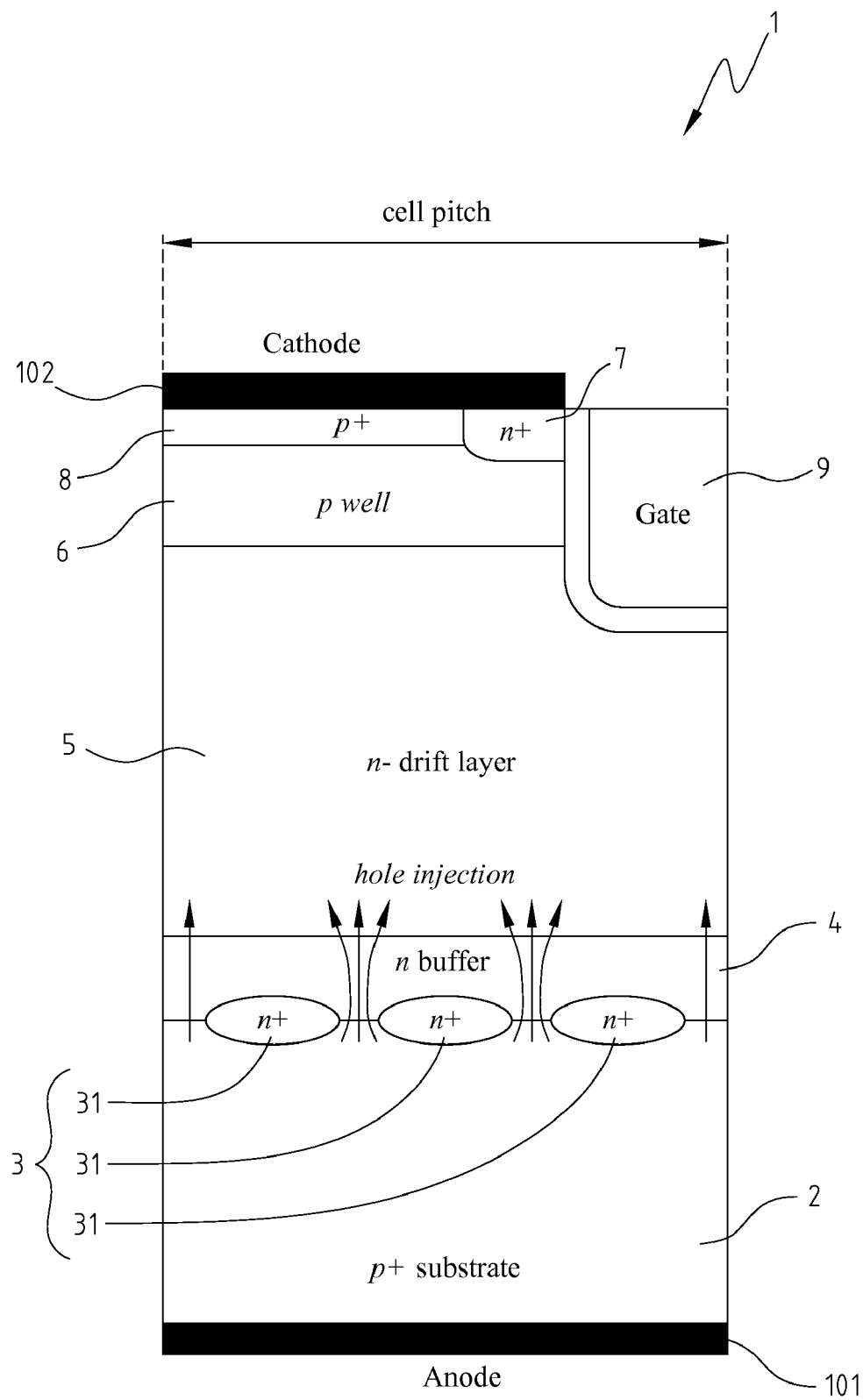
FIG. 7 shows schematically the hole current injection path during the on-state of an example of a device according to a first embodiment of the present invention.

In state of the art vertical IGBTs the adjustment of the excess charge in the drift layer is done through either adjusting the doping of the p anode layer, the doping of the n buffer or the lifetime in the n− drift layer 5. Here it is done through controlling the layout geometry of the n+ islands 31 formed partly in the p+ substrate 2 and partly in the n buffer 4. FIG. 7 shows schematically the hole current injection path during the on-state of an example of a device according to a first embodiment of the present invention. The hole current can only flow through adjacent n+ islands 3, but cannot penetrate the n+ regions, as shown in FIG. 7.

Figure 8:
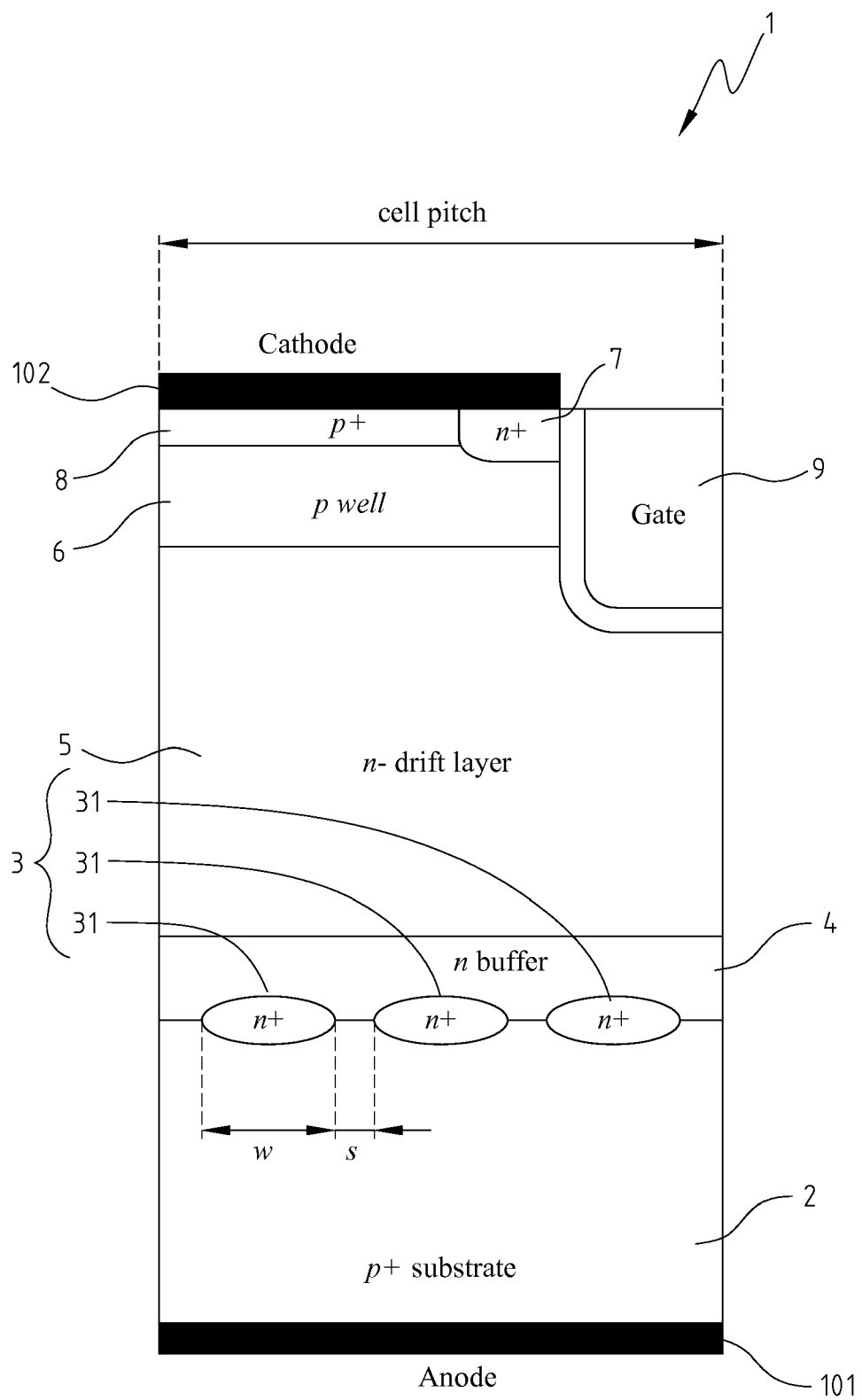
FIG. 8 shows schematically shape, configuration, and position of a plurality of lateral floating islands.
Figure 9:
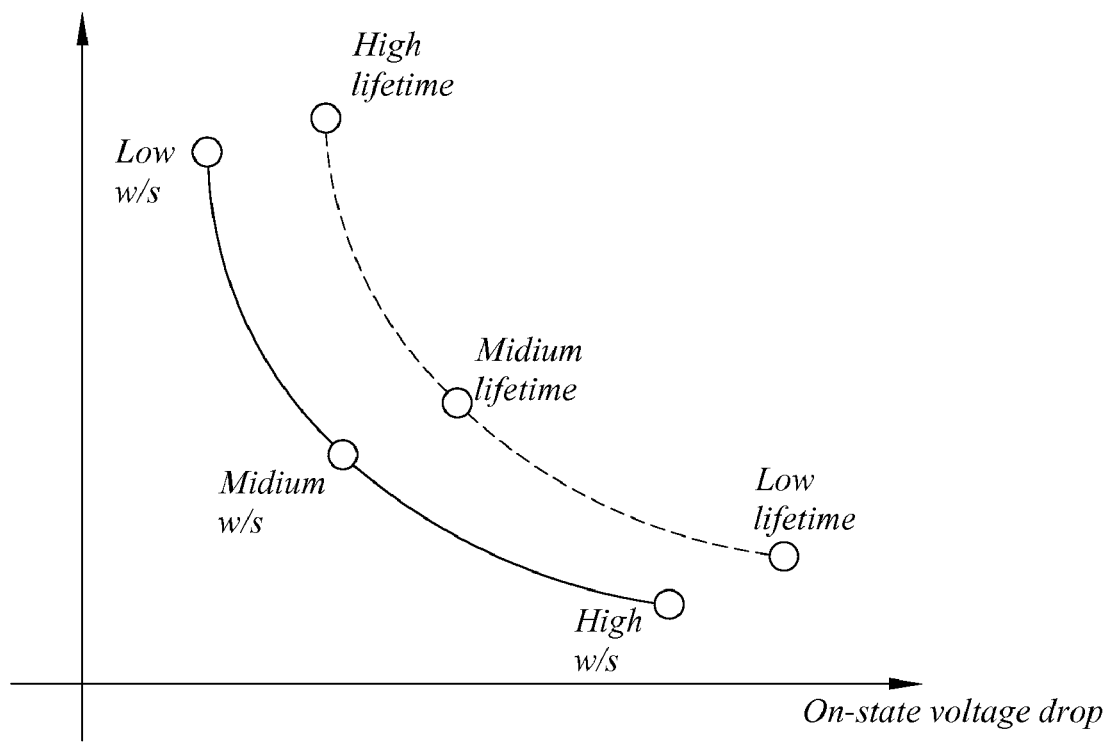
FIG. 9 shows schematically how the trade-off between the on-state and switching energy losses can be adjusted by changing the width-to-spacing ratio for the vertical islands in a vertical insulated gate bipolar transistor.

FIG. 8 shows schematically shape, configuration, and position of a plurality of lateral floating islands. If w is the width of one n+ island 31 and s the spacing between two adjacent n+ islands 31, (FIG. 8) then a higher w/s leads to lower injection efficiency, lower excess charge in the n− drift layer 5 and faster switching at the expense of higher voltage drop in the on-state for a given current density. On the opposite, lower w/s leads to higher injection efficiency, more excess charge formed in the n− drift layer 5 and as a result lower voltage drop during on-state operation for a given current density (FIG. 9). This comes at the expense of slower and more lossy switching.

The advantage of the technique according to this invention is that it does not need to use thin wafer technologies such as those employed in SPT or FS IGBTs, nor does it use the less reliable technique of electron irradiation. Instead, the injection efficiency can be simply adjusted by varying the mask layout for the n+ islands. Compared to the standard technique of lifetime killing, for example by irradiation, the technique according to this invention offers a better trade-off between the on-state performance and switching. FIG. 9 shows schematically how the trade-off between the on-state and switching energy losses can be adjusted by changing the width-to-spacing ratio for the vertical islands in a vertical insulated gate bipolar transistor. As shown in FIG. 9, a device using the technique according to this invention offers lower transient energy losses for the same on-state voltage drop than a device using the state-of-the-art technique of lifetime killing. An additional advantage of the technique according to this invention is that the injection efficiency is not set by the doping of the p-anode 101, which can vary significantly from wafer to wafer or from one semiconductor lot to another, but by the layout dimensions of the n+ islands 31. These dimensions can be very tightly controlled using photolithography. According to this invention, small deviation in the p+ substrate doping or in the doping of the n+ islands 31 would not have a great impact on the injection efficiency.

Figure 10:
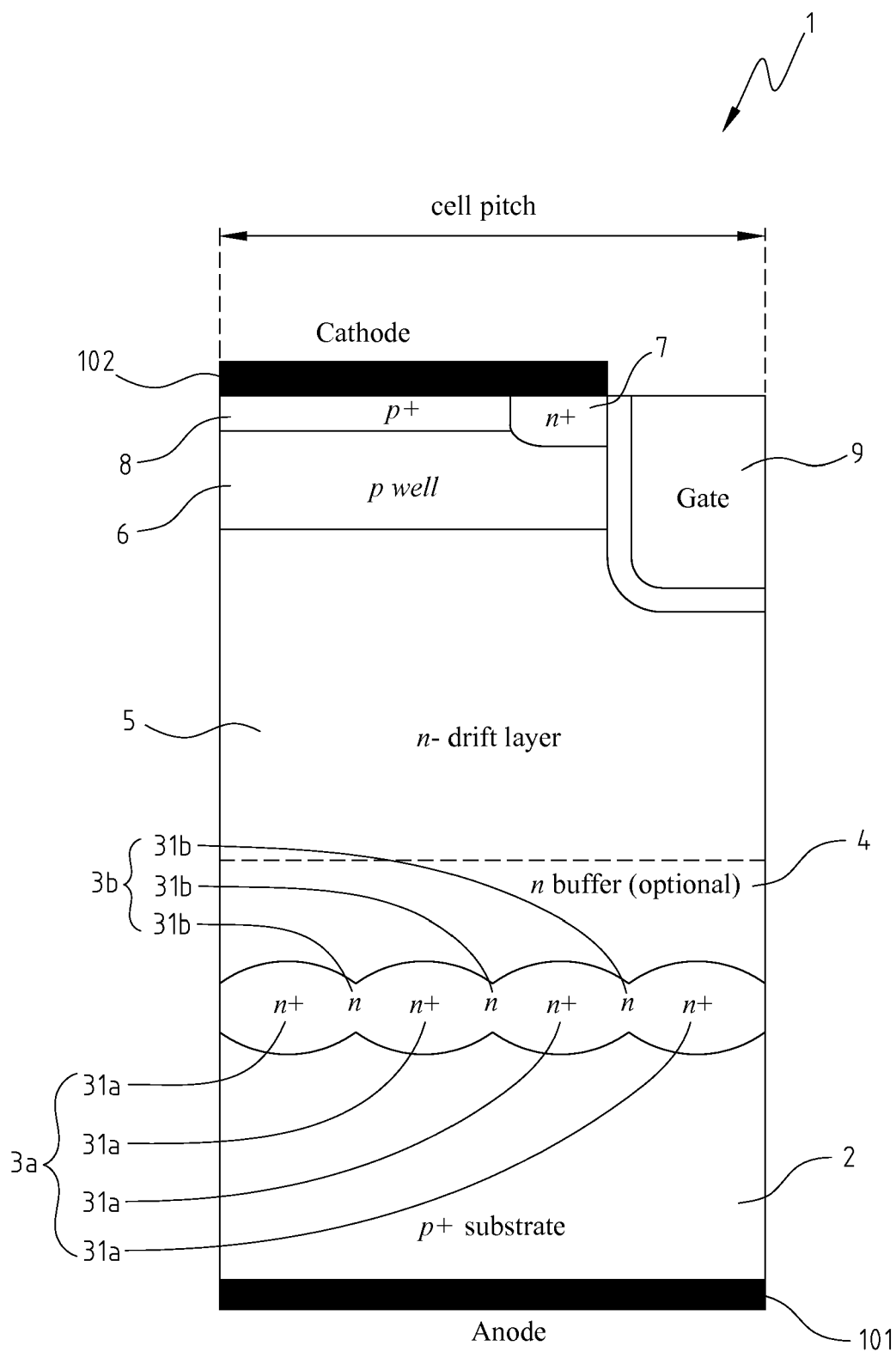
FIG. 10 shows schematically the hole current injection path during the on-state of an example of a device according to a second embodiment of the present invention.

FIG. 10 shows schematically the hole current injection path during the on-state of an example of a device according to a second embodiment of the present invention. According to a second aspect of this invention and referring to FIG. 10, there is provided a vertical device in the form of an insulated gate bipolar transistor (IGBT) 1, that includes a p+ substrate 2, an optional n buffer 4, a continuous n+/n layer 3a/3b, that is arranged in multiple alternate regions of n+ 3a and n layers 3b, overlapping the p+ substrate 2 and optionally overlapping the n buffer 4, a n− drift layer 5, a p well 6, an n+ cathode/source region 7, a p+ cathode short region 8, an insulated gate 9 formed of a gate oxide and a polysilicon layer and metallisation layers for the anode 101 and cathode 102; wherein the continuous n+/n layer 3a/3b adjusts the level of excess charge (plasma) in the on-state and thus adjusts the level of conductivity modulation of the n– drift layer 5, and as a result the on-state versus switching performance of the device 1. The discretised n+ layer 3a comprises a plurality of n+ islands 31a, and the discretised n layer 3b comprises a plurality of n islands 31b.

Preferably the doping level of the n+ islands 31a is higher than that of the p+ substrate 2 while that of the n islands 3b is comparable or lower than that of the p+ substrate 2. Preferable the n islands 31b are formed during the lateral diffusion of the n+ layer 3a. Preferably there are no additional masks for the n layer 3b, but the n layer 3b is formed following the masked implantation of the n+ layer 3a and their lateral diffusion during the drive-in and formation of the other layers in the structure. Preferably the lateral diffusions of adjacent n+ layer 3a meet forming a continuous n+/n layer.

Since the n+/n layer 3a/3b covers the entire interface between the p+ substrate 2 and the n– drift layer 5, a buffer layer is no longer necessary (but only optional) to avoid punch-through. Thus the continuous n+/n layer 3a/3b stops the depletion region during the device blocking mode to touch the p+ substrate 2, and hence it avoids premature breakdown through punch-through.

Figure 11:
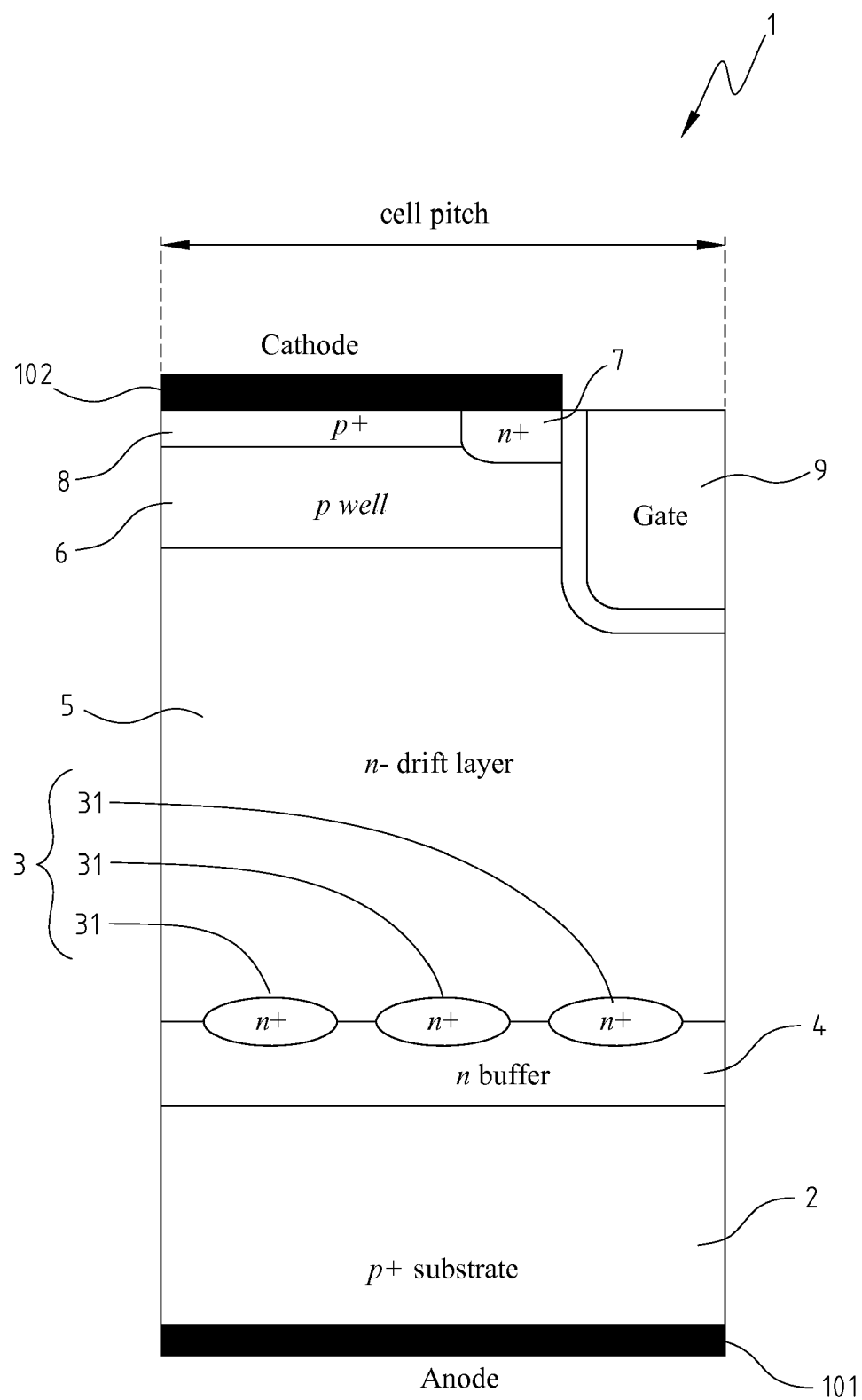
FIG. 11 shows schematically the hole current injection path during the on-state of an example of a device according to a third embodiment of the present invention.

FIG. 11 shows schematically the hole current injection path during the on-state of an example of a device according to a third embodiment of the present invention. According to a third aspect of this invention and referring to FIG. 11, there is provided a vertical device in the form of an insulated gate bipolar transistor (IGBT) 1, that includes a p+ substrate 2, a n buffer 4, a n– drift layer 5, a discretised n+ layer 3 that is arranged in multiple regions overlapping the n buffer 4 and the n– drift layer 5, a p well 6, an n+ cathode/source region 7, a p+ cathode short region 8, an insulated gate 9 formed of a gate oxide and a polysilicon layer and metallisation layers for the anode 101 and cathode 102, wherein the geometry/layout dimensions of the discretised n+ layer 3 adjusts the level of excess charge (plasma) in the on-state and thus adjusts the level of conductivity modulation of the n– drift layer 5, and as result the on-state versus switching performance of the device 1. The discretised n+ layer 3 also comprises a plurality of n+ islands 31.

Figure 12:
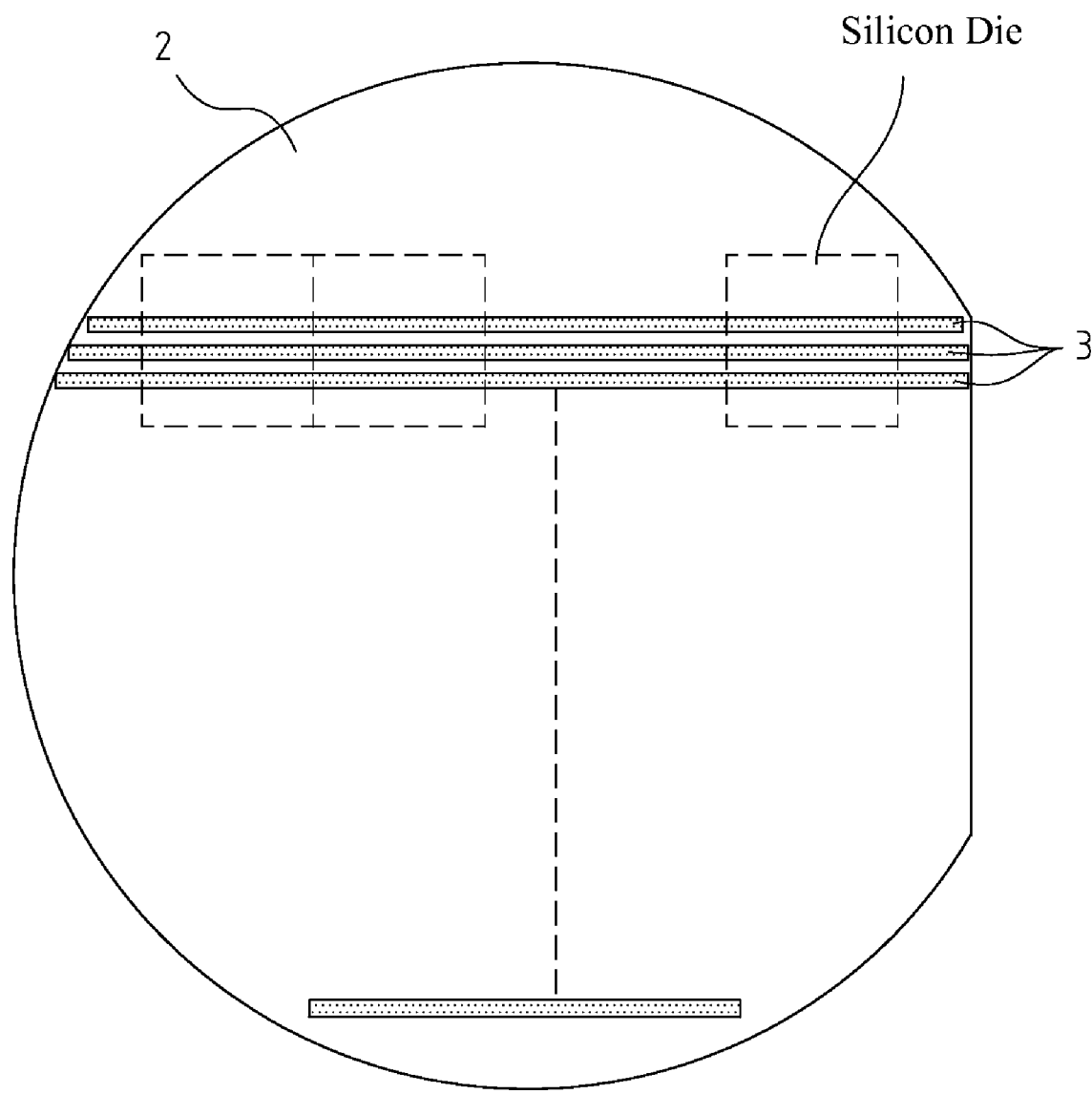
FIG. 12 shows schematically an example of the placement of the n+ discretised layer, across a semiconductor wafer, according to all embodiments of this invention.

FIG. 12 shows schematically an example of the placement of the n+ discretised layer 3, across a semiconductor wafer, according to all embodiments of this invention. As shown in FIG. 12, we can see an example of the placement of the discretised n+ layer 3, across a semiconductor wafer, according to all aspects of this invention. And n+ stripes are shown with the spacing and the widths of theses stripes determining the optimal amount of plasma in the drift region. Other geometrical patterns for the n+ islands 31, such as squares, circles etc can be used.

Figure 13A:
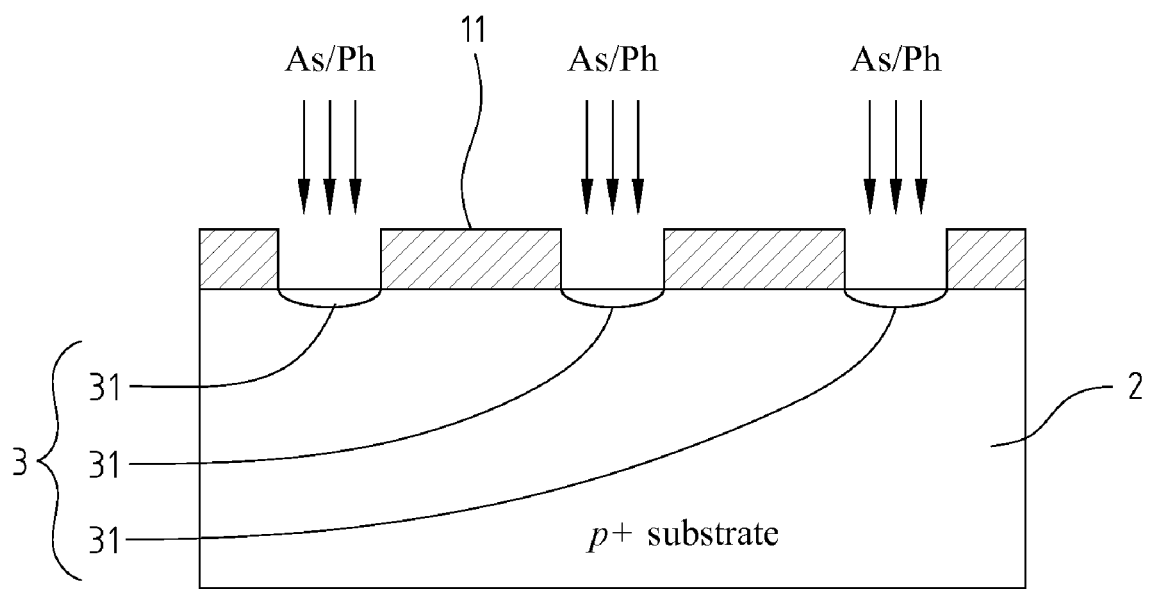
FIG. 13a shows schematically implantation of n-type impurities through a mask in the p+ substrate of a method of fabricating a device according to all embodiments of the invention.
Figure 13B:
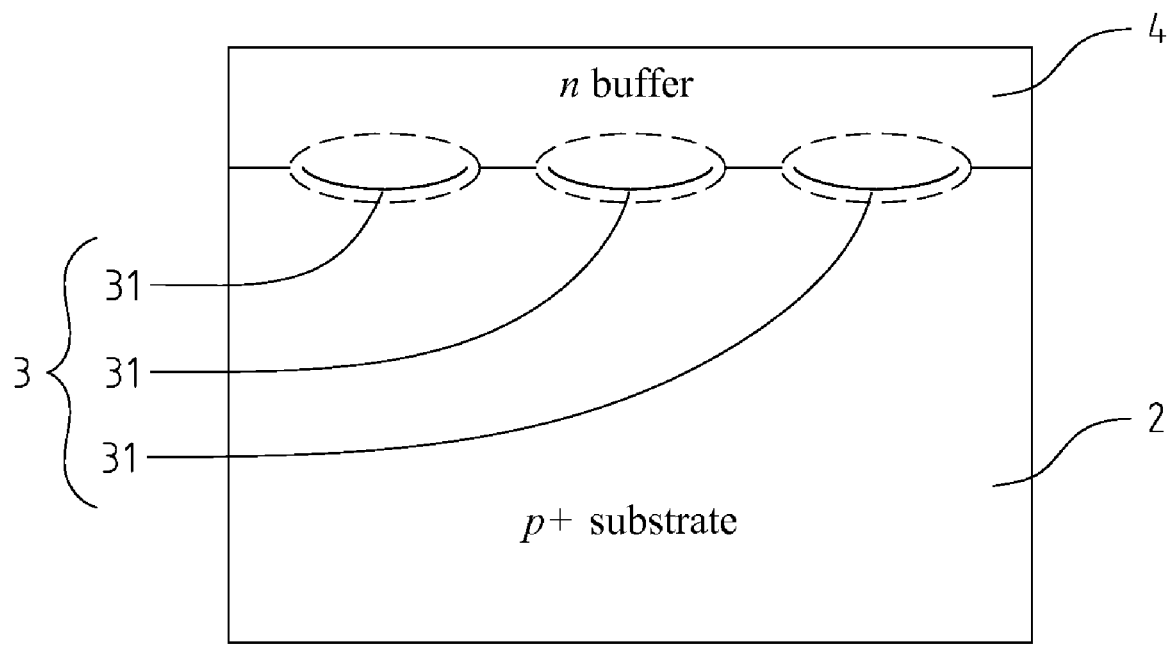
FIG. 13b shows schematically epitaxial growth of n buffer of a method of fabricating a device according to all embodiments of the invention.
Figure 13C:
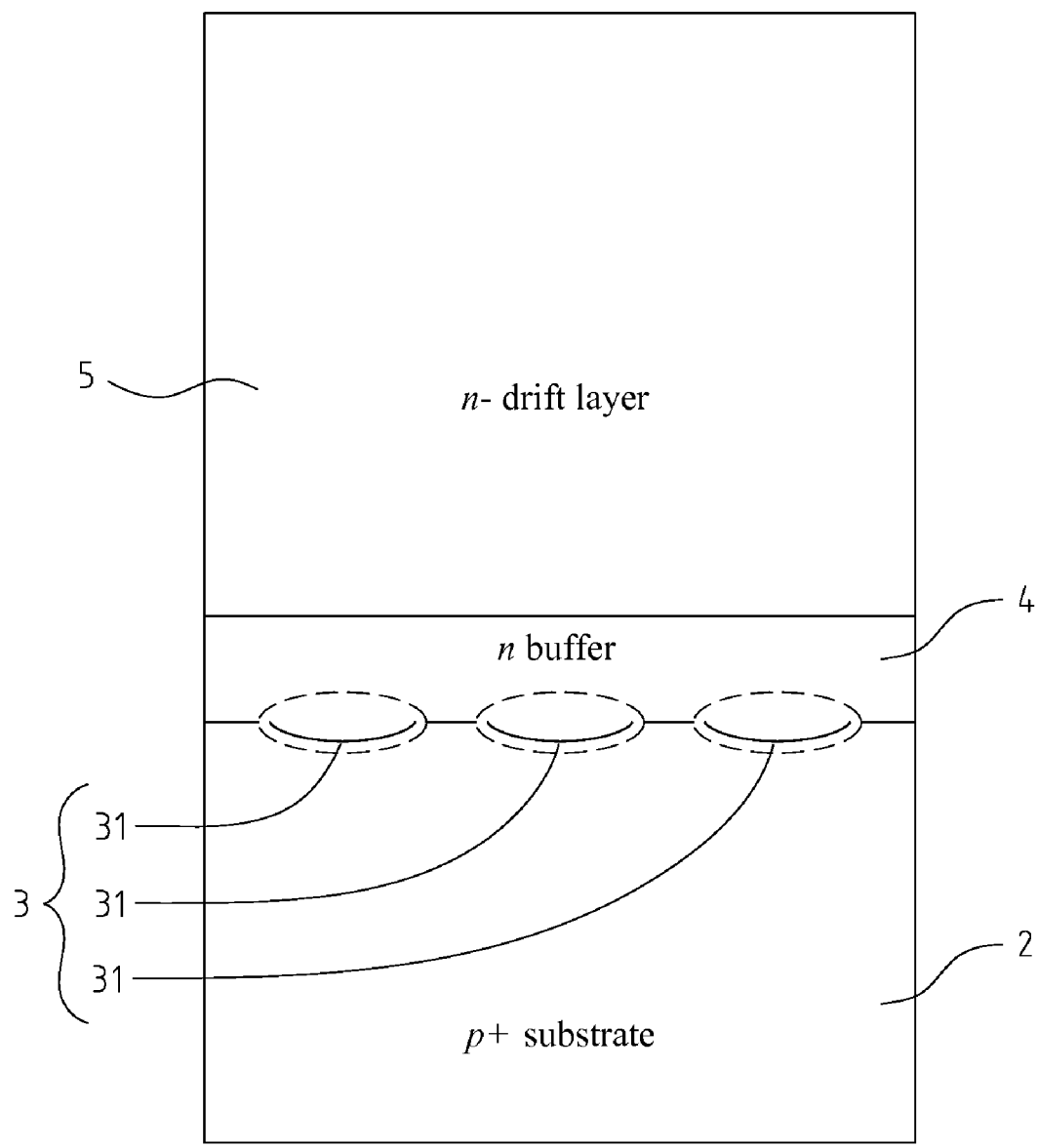
FIG. 13c shows schematically epitaxial growth of n− drift region of a method of fabricating a device according to all embodiments of the invention.
Figure 13D:
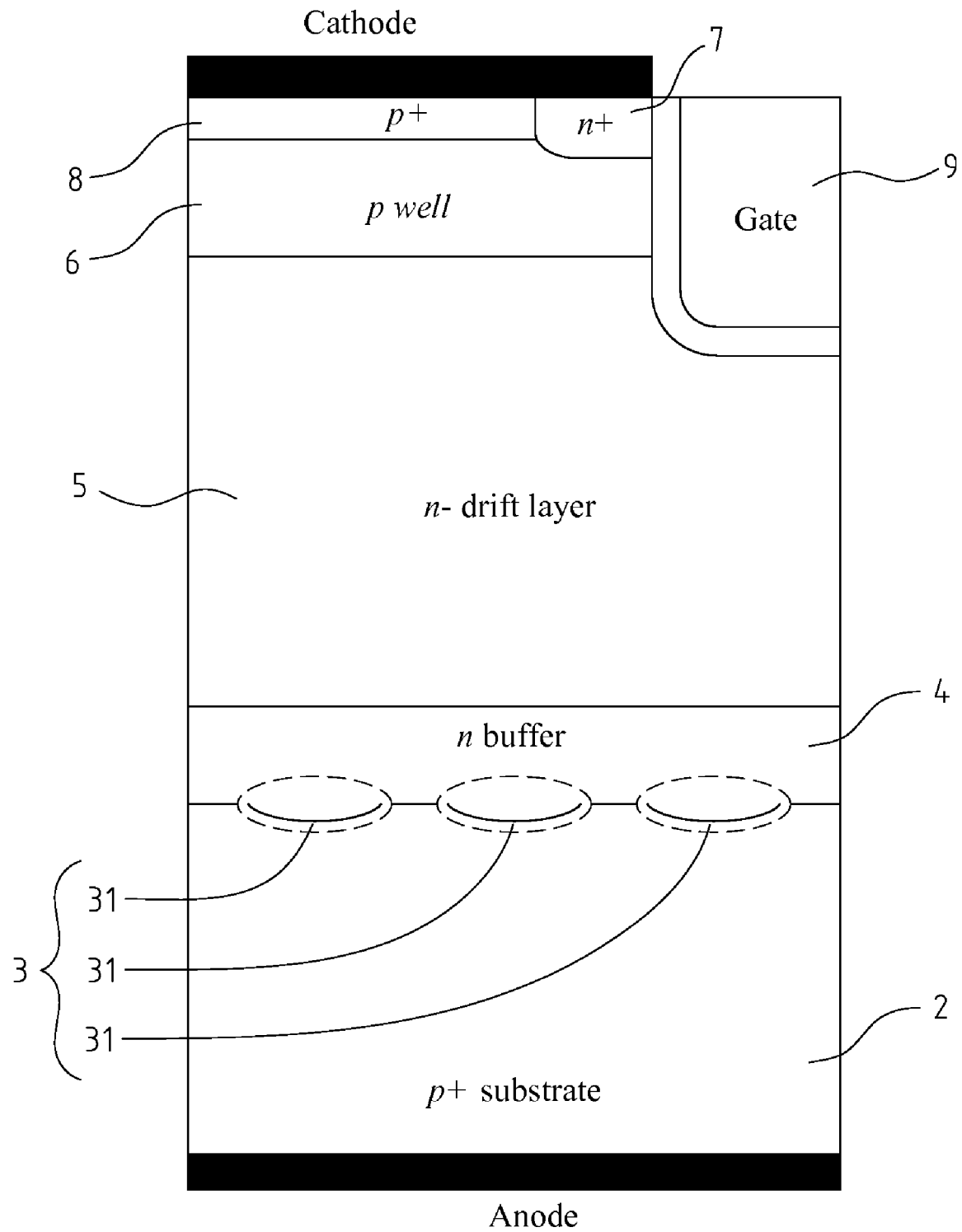
FIG. 13d shows schematically formation of the top layers and metallization of a method of fabricating a device according to all embodiments of the invention.

FIGS. 13a-13d show a method of fabricating a device 1 according to the first and second aspects of this invention. FIG. 13a shows schematically implantation of n– type impurities through a mask in the p+ substrate of a method of fabricating a device according to all embodiments of the invention. As shown in FIG. 13a a masked ion implantation of As or Ph into the p+ substrate 2 is carried out. The mask 11 (not shown) is designed to obtain an optimal amount of plasma in the drift region. FIG. 13b shows schematically epitaxial growth of n buffer of a method of fabricating a device according to all embodiments of the invention. As shown in FIG. 13b, the n buffer 4 epitaxial growth is provided. FIG. 13c shows schematically epitaxial growth of n– drift layer 5 of a method of fabricating a device according to all embodiments of the invention. As shown in FIG. 13c, the n– drift layer 5 epitaxial growth is provided. FIG. 13d shows schematically formation of the top layers and metallization of a method of fabricating a device according to all embodiments of the invention. As shown in FIG. 13d, all other layers, as known in the art of IGBTs, are formed. During the epitaxial growths and the formation of all other layers, the n+ islands 31 diffuse vertically and laterally into the p+ substrate 2 and the n buffer 4.

If the lateral diffusions of two adjacent n+ layers 3 meet, according to the second aspect of this invention, then the presence of the n buffer layer 4 becomes optional.

Alternatively, a method of fabricating a device 1 according to the third aspect of this invention comprises steps of the n buffer 4 epitaxial growth, a masked implantation of As or Ph into the n buffer layer to form the discretised n+ layer 3, epitaxial growth of the n– drift layer 5, and formation of other layers, as known in the art of IGBTs. During the epitaxial growths and the formation of all other layers, the n+ islands 31 diffuse vertically and laterally into the n buffer 4 and the n– drift layer 5.

For a 600 V rated device, an example of the geometrical dimensions and the conductivity of the main layers according to this invention are given below:

p+ substrate 2 resistivity=0.01–0.04 Ω-cm, with wafer thickness between 200 and 500 μm the n+ masked implantation of the n+ islands 31: As, dose: 1–4×10$^{15}$ cm$^{-2}$, 10-50 KeV, w=4 μm, s=0.5–4 μm the n type buffer 4, resistivity=0.05–0.2 Ω-cm, thickness: 5-15 μm the n– drift layer 5 resistivity=75–90 Ω-cm (for a 600 V device), with a thickness of 50-60 μm Although the device 1 is shown to employ a trench geometry, the invention is also applicable to other types of insulated gate geometries, such as planar (DMOS) or V-shape. Other types of vertical IGBts such as double gate IGBTs, or IGBT with extra p+ collectors, as known in the state-of-the-art can be sued in conjunction with this invention.

If the invention has been described hereinafter with reference to specific embodiment, numerous variations and alternative configurations will be apparent to the man skilled in the art. Accordingly it will be apparent to the man skilled in the art that such variations and alternative configurations are also embraced by the present invention and the scope of the invention is restricted only in accordance with the accompanying claims and equivalents thereof.

What is claimed is:

1. A vertical bipolar high voltage/power semiconductor device, comprising:

a low voltage terminal;

a high voltage terminal;

a vertical drift region of a first conductivity type and having vertical first end second ends;

the vertical first end of the vertical drift region having adjacent thereto a vertical region of the first conductivity type vertically connected directly to the low voltage terminal or a vertical region of a second conductivity type vertically connected indirectly via a vertical further region to the low voltage terminal;

a vertical region of the second conductivity type at the vertical second end of the vertical drift region vertically connected directly to the high voltage terminal; and a plurality of electrically floating lateral island regions within the vertical drift regions at or towards the vertical second end of the vertical drift region, the plurality of electrically floating lateral island regions being of the first conductivity type and being more highly doped than the vertical drift region.

2. The device as claimed in claim 1, wherein at least one of the electrically floating lateral island regions is entirely within the vertical buffer region.

3. A vertical bipolar high voltage/power semiconductor device, comprising:
   a low voltage terminal;
   a high voltage terminal;
   a vertical drift region of a first conductivity type and having vertical first end second ends;
   the vertical first end of the vertical drift region having adjacent thereto a vertical region of the first conductivity type vertically connected directly to the low voltage terminal or a vertical region of a second conductivity type vertically connected indirectly via a vertical further region to the low voltage terminal;
   a vertical buffer region of the first conductivity type at the vertical second end of the vertical drift region;
   a vertical region of the second conductivity type on the other side of the vertical buffer region and vertically connected to the high voltage terminal such that the vertical buffer region is between the vertical second end of the vertical drift region and said vertical region of the second conductivity type; and
   a plurality of electrically floating lateral island regions provided at least partly within the vertical buffer region or at least partly within the vertical drift regions at or towards the vertical second end of the vertical drift region, the plurality of electrically floating lateral island regions being of the first conductivity type and being more highly doped than the vertical drift region.

4. The device as claimed in claim 3, wherein at least one of the electrically floating lateral island regions is entirely within the vertical buffer region.

5. The device as claimed in claim 3, wherein at least one of the electrically floating lateral island regions is partly within the vertical buffer region and partly within the vertical drift region.

6. The device as claimed in claim 3, wherein the device is a 600V rated device.

7. The device as claimed in claim 6, wherein thickness of the vertical region of the second conductivity type is between 200 and 500 μm.

8. The device as claimed in claim 7, wherein a range of resistivity of the vertical region of the second conductivity type is from 0.01 to 0.04 Ω-cm.

9. The device as claimed in claim 6, wherein As is used in implantation of the plurality of electrically floating lateral island regions.

10. The device as claimed in claim 6, wherein the vertical buffer region is a n-type buffer with resistivity of 0.05-0.2 Ω-cm.

11. The device as claimed in claim 10, wherein the vertical buffer region is a n-type buffer of thickness of 5 to 15 μm.

12. The device as claimed in claim 6, wherein a range of resistivity of the vertical drift region is from 75 to 90 Ω-cm.

13. The device as claimed in claim 12, wherein a range of thickness of the vertical drift region is from 5 to 15 μm.

* * * * *